(12) United States Patent
Toshinari et al.

(10) Patent No.: US 6,226,196 B1
(45) Date of Patent: May 1, 2001

(54) PIEZOELECTRIC TRANSFORMER INVERTER

(75) Inventors: Kyoji Toshinari, Kyoto; Yasuyuki Morishima, Kyotanabe, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/541,676

(22) Filed: Mar. 31, 2000

(30) Foreign Application Priority Data

Apr. 16, 1999 (JP) ................................................. 11-109040

(51) Int. Cl.[7] .................................................. H02M 7/538
(52) U.S. Cl. ............................................. 363/134; 315/55
(58) Field of Search ............................... 363/134, 40, 97, 363/21, 131; 315/55

(56) References Cited

U.S. PATENT DOCUMENTS 5,923,546 * 7/1999 Shimada et al. ...................... 363/40
6,134,133 * 10/2000 Noma et al. ......................... 363/134

FOREIGN PATENT DOCUMENTS

| 8-149850 | 6/1996 | (JP) . |
| 9-199289 | 7/1997 | (JP) . |
| 9-219292 | 8/1997 | (JP) . |
| 9-237684 | 9/1997 | (JP) . |

* cited by examiner

*Primary Examiner*—Shawn Riley
(74) *Attorney, Agent, or Firm*—Ostrolenk, Faber, Gerb & Soffen, LLP

(57) ABSTRACT

A piezoelectric transformer inverter can be driven in wide ranges of input voltages and output currents so that a wide range of dimming can be achieved. Furthermore, the piezoelectric transformer inverter can maintain high efficiency in the overall driven ranges thereof so as to yield stable luminance. The above piezoelectric transformer inverter includes a piezoelectric transformer drive unit having conductive elements, switching elements, and a phase drive circuit to convert an inputted AC voltage into an AC voltage having a substantially constant frequency which is lower than the inputted AC voltage and output to a piezoelectric transformer, a phase-difference detecting unit for detecting the phase difference between a drive controlling signal of one of the switching elements and an output current or output voltage of the piezoelectric transformer to output a control voltage corresponding to the phase difference, and a frequency control circuit for outputting a pulse voltage signal of a frequency based on the control voltage to the phase drive circuit of the piezoelectric transformer drive unit.

12 Claims, 12 Drawing Sheets

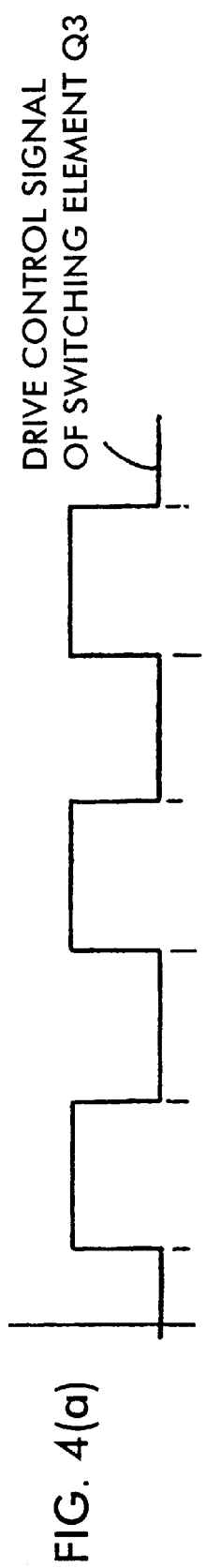
FIG. 4(a) DRIVE CONTROL SIGNAL OF SWITCHING ELEMENT Q3
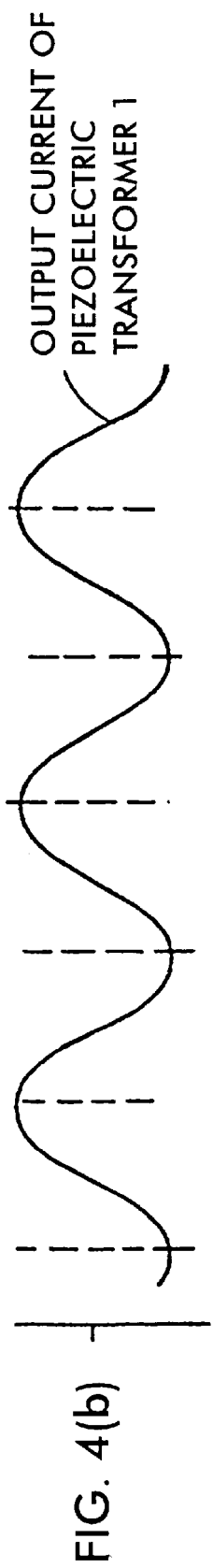
FIG. 4(b) OUTPUT CURRENT OF PIEZOELECTRIC TRANSFORMER 1
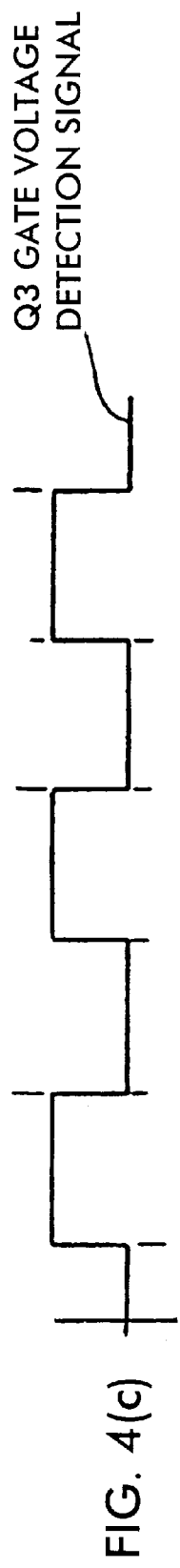
FIG. 4(c) Q3 GATE VOLTAGE DETECTION SIGNAL
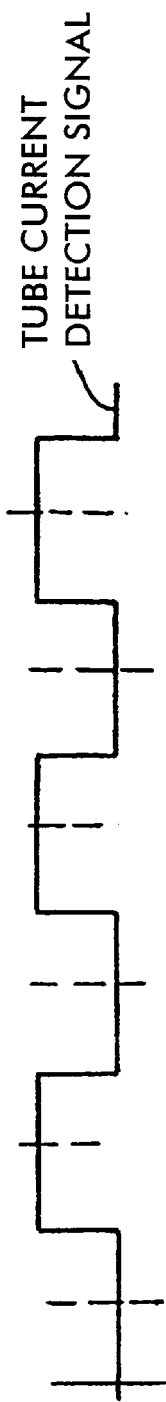
FIG. 4(d) TUBE CURRENT DETECTION SIGNAL
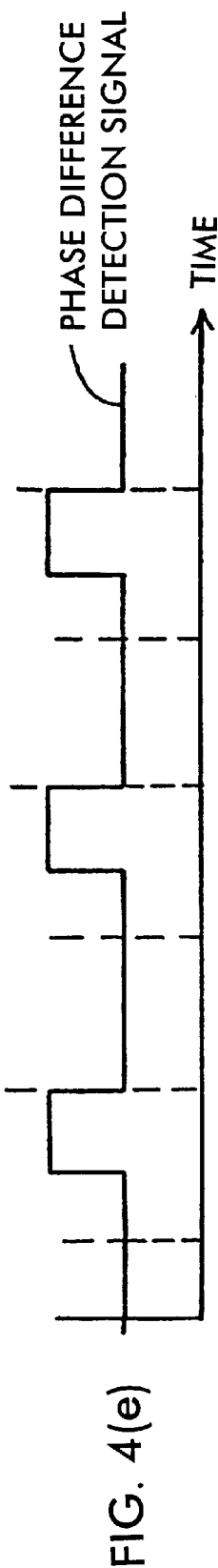
FIG. 4(e) PHASE DIFFERENCE DETECTION SIGNAL

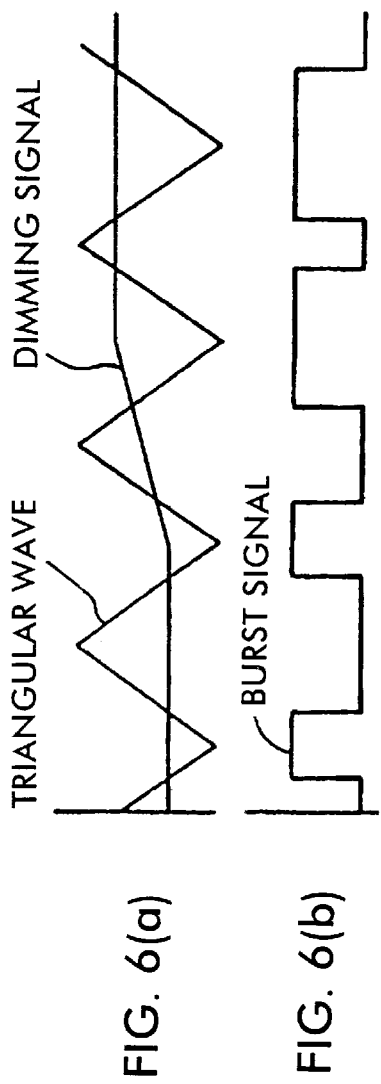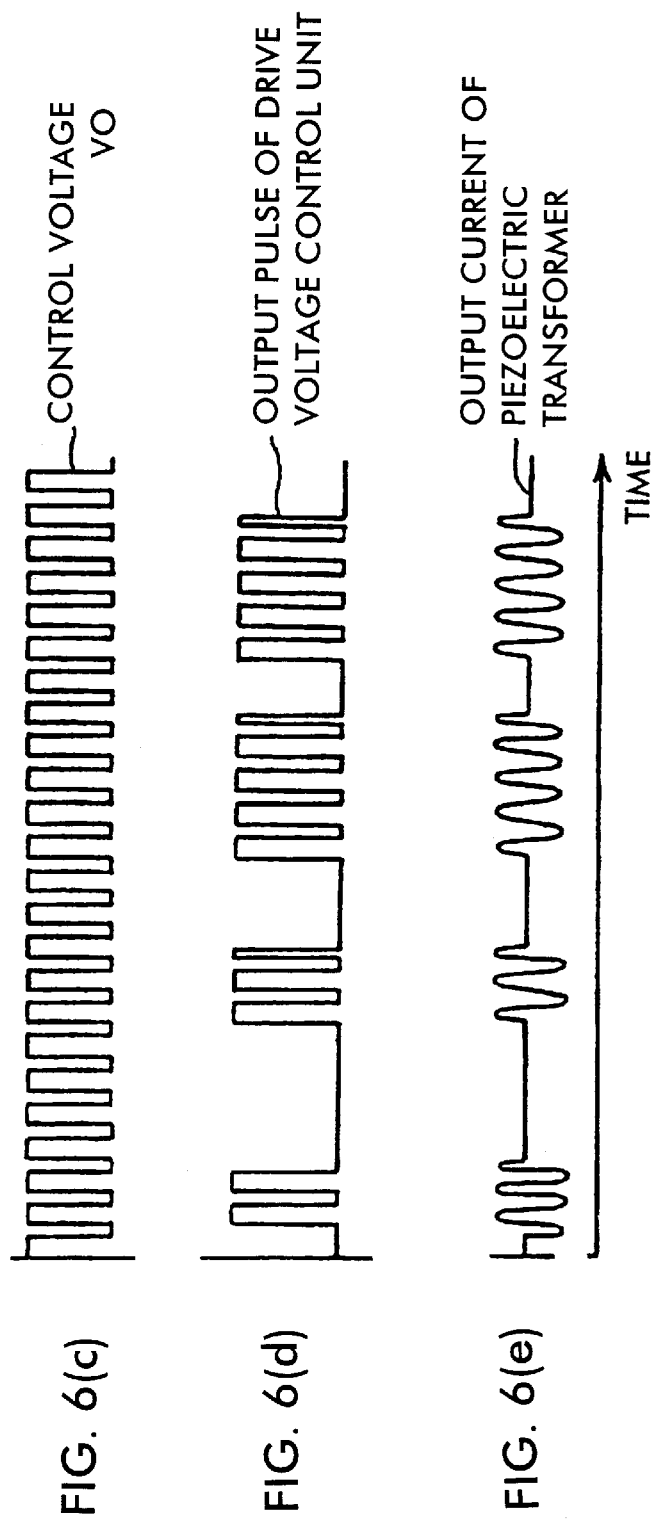

PIEZOELECTRIC TRANSFORMER INVERTER

BACKGROUND OF THE INVENTION

1. Field of the Invention

The present invention relates to piezoelectric transformer inverters in which loads are driven by piezoelectric transformers. More specifically, the invention relates to piezoelectric transformer inverters capable of being used for lighting discharge tubes such as cold-cathode tubes and for adjusting the luminance of the discharge tubes.

2. Description of the Related Art

Recently, backlight liquid crystal display devices have been widely used. As a light source for backlight, a fluorescent tube, such as a cold-cathode fluorescent tube, is used.

In order for a fluorescent tube to be lit, a high-tension AC voltage must be applied. In addition, as an input power source for a portable information-processing device such as a notebook personal computer, a battery is usually used in conjunction with an AC adapter. Thus, in order to light the above-mentioned fluorescent tube, it is necessary to convert a low DC voltage into a high AC voltage capable of lighting the fluorescent tube. As a conventional fluorescent-tube lighting system, a DC/AC inverter incorporating an electromagnetic transformer has been used.

However, in order to improve miniaturization, efficiency, and operational stability of equipment, a piezoelectric transformer inverter incorporating a piezoelectric transformer has recently been used as an alternative to an electromagnetic transformer.

A piezoelectric transformer inverter is required to be controlled in such a manner that each value of an output voltage and an output current with respect to a load is set to be a desired value. As such a control system, a constant phase-difference control system is known. This system focuses on frequency characteristics of the phase difference between an input voltage and an output voltage of a piezoelectric transformer.

For example, Japanese Unexamined Patent Publication No. 9-237684 provides a system for controlling a pulse voltage signal driving a piezoelectric transformer, in which the phase difference between an input voltage and an output voltage of the piezoelectric transformer is detected to perform frequency control such that the phase difference value is set to be a specified value, and a tube current is detected to drive the piezoelectric transformer in such a manner that the tube current value is maintained to be a desired value.

Similarly, Japanese Unexamined Patent Publication No. 8-149850 provides a system in which the phase difference between an input voltage and an output voltage of the piezoelectric transformer is detected so as to perform frequency control in such a manner that the phase difference value is set to be a specified value. However, in the system described in Japanese Unexamined Patent Publication No. 9-237684, a pulse voltage obtained by controlling the duty ratio of a frequency higher than the driving frequency of the piezoelectric transformer is supplied to a piezoelectric transformer drive unit. In contrast, in the system described in Japanese Unexamined Patent Publication No. 8-149850, the piezoelectric transformer is intermittently driven by a frequency lower than the driving frequency of the piezoelectric transformer.

In addition, Japanese Unexamined Patent Publication No. 9-219292 describes a system in which the phase difference between an input voltage of a piezoelectric transformer and a detection voltage obtained by the voltage conversion of a tube current is detected to perform frequency control in such a manner that the phase difference value is set to be a desired value.

In addition, Japanese Unexamined Patent Publication No. 9-199289 describes a system in which the phase difference between an input voltage and an output voltage of a piezoelectric transformer is detected to perform frequency control in such a manner that the phase difference value is set to be a desired value. In both the aforementioned control systems described in Japanese Unexamined Patent Publication No. 9-219292 and Japanese Unexamined Patent Publication No. 9-199289, only the above-described frequency control is performed, and there is no description of a pulse-width control and burst control of a pulse voltage signal driving the piezoelectric transformer.

In the constant phase-difference control systems in the above-described conventional piezoelectric transformer inverters, one of the signals detecting the phase difference forms an input voltage waveform of the piezoelectric transformer. The input voltage waveform of the piezoelectric transformer is usually the waveform of a sine wave or is similar to that of a sine wave in order to efficiently drive the piezoelectric transformer.

The above sine wave is generated by a particular LC resonance. An input capacitance of the piezoelectric transformer is often used as the capacitance of a resonator.

FIG. 12 shows a typical equivalent circuit of a piezoelectric transformer. The equivalent input capacitance of the piezoelectric transformer changes greatly depending on various factors such as frequency, load, input voltage, and temperature.

FIG. 13 shows the frequency dependences of input capacitance and input impedance of a piezoelectric transformer. As is evident in FIG. 13, the input capacitance changes greatly according to the frequency. In addition to the frequency, as described above, the load, the input voltage, and the temperature permit the input capacitance to be greatly changed.

As a result, with the changes in the above-described parameters, distortion tends to occur in the input voltage waveform of the piezoelectric transformer. Furthermore, the cycle and the peak value of the input voltage waveform of the piezoelectric transformer change significantly.

Thus, it is very difficult to obtain a pure phase-difference detection signal from the input voltage waveform of the piezoelectric transformer.

In addition, when burst dimming is performed, it is necessary to intermittently operate the inverter at a frequency equivalent to or lower than the driving frequency of the piezoelectric transformer. In this case, since the input voltage waveform of the piezoelectric transformer does not occur during a burst-off period, it is impossible to obtain the phase-difference detection signal from the input voltage waveform of a piezoelectric transformer.

As described above, in Japanese Unexamined Patent Publication No. 9-219292 and Japanese Unexamined Patent Publication No. 9-199289, the frequency control is performed in such a manner that the phase difference is set to be constant. However, since the phase difference is approximately depended on frequency, when the phase difference is controlled to be constant, the frequency also becomes constant. Thus, when the input voltage has a wide range, for example, from 7 to 20V, tube current increases or decreases approximately in proportion to the input voltage. As a result, since the luminance of a fluorescence tube is approximately proportional to the tube current, the luminance becomes unstable due to the changes in the input voltage.

In addition, in Japanese Unexamined Patent Publication No. 9-237684, with respect to changes in input voltage, the input voltage of the piezoelectric transformer is stabilized by adjusting the electrical power of an oscillation pulse voltage signal outputted at a part where the piezoelectric transformer is driven. However, dimming is performed by continuously controlling the tube current by controlling an average input voltage of the piezoelectric transformer. As a result, when a widely ranging dimming such as a dimming ranging from 10 to 100% is performed, the above-described control systems cannot be used. In other words, the normal range of the tube current of a cold-cathode tube is narrow, for example, ranging from 2 to 5 mA rms, and the luminance is approximately proportional to the tube current. As a result, it is very difficult to broaden the dimming range by using a dimming method which continuously controls the tube current.

Furthermore, in Japanese Unexamined Patent Publication No. 8-149850, the piezoelectric transformer is intermittently driven by a frequency lower than the piezoelectric transformer driving frequency, by which the tube current is switched on and off by a frequency equivalent to or higher than a visible frequency so as to achieve dimming. For example, when an on and off ratio is set to be in a range of 10% to 100%, a dimming range of 10% to 100% is obtained.

However, in a manner similar to that of the aforementioned cases, in the conventional art described in Japanese Unexamined Patent Publication No. 8-149850, when the input voltage has a wide range, such as a range of 7 to 20V, the tube current obtained when the tube current is in an on state increases and decreases approximately in proportion to the input voltage. Therefore, the luminance becomes unstable due to changes in the input voltage.

SUMMARY OF THE INVENTION

Accordingly, it is an object of the present invention to solve the above-described problems in the conventional art and to provide a piezoelectric transformer inverter capable of being driven over wide ranges of input voltages and output currents, achieving a wide range of dimming, and maintaining high efficiency in the overall driven ranges thereof so as to obtain luminance stability.

According to an aspect of the present invention, there is provided a piezoelectric transformer inverter in which a load is driven by a piezoelectric transformer. The piezoelectric transformer inverter includes a piezoelectric transformer, which has input electrodes and output electrodes and which boosts an AC voltage applied between the input electrodes to supply the boosted AC voltage to a load connected to the output electrode; a piezoelectric transformer drive unit connected to the piezoelectric transformer to drive the piezoelectric transformer, the piezoelectric transformer drive unit having conductive elements, switching elements, and a phase drive circuit into which a pulse voltage signal for driving the switching elements is inputted, and converting an inputted AC voltage into an AC voltage of a substantially constant frequency lower than the inputted voltage to output to the piezoelectric transformer; a phase-difference detecting unit for detecting the phase difference between a driving signal which controls the on-off operation of the switching elements and an output current or an output voltage of the piezoelectric transformer to output a control voltage corresponding to the phase difference; and a frequency control unit for outputting a pulse voltage signal of a frequency based on the control voltage outputted from the phase-difference detecting unit to the phase difference drive circuit of the piezoelectric transformer drive unit so that the value of the phase difference can be a desired value.

Preferably, the piezoelectric transformer inverter also includes a drive voltage control unit connected between a DC power source and the piezoelectric transformer drive unit to convert a DC voltage supplied from the DC power source into a variable duty-ratio pulse voltage by a frequency higher than a DC frequency or a piezoelectric transformer driving frequency so as to perform control in such a manner that an average voltage outputted to the piezoelectric transformer drive unit can have a constant value.

In addition, preferably, the piezoelectric transformer inverter according to the above-described aspect of the present invention also includes a drive voltage control unit connected between a DC power source and the piezoelectric transformer drive unit, the drive voltage control unit converting a DC voltage supplied from the DC power source into a variable duty-ratio pulse voltage by a frequency higher than a DC frequency or a piezoelectric transformer driving frequency to control an average voltage outputted to the piezoelectric transformer drive unit so that the value of the output current of the piezoelectric transformer is set to be a desirable value.

In addition, in the above-described piezoelectric transformer inverter, the drive voltage control unit preferably has a chopper, and the switching elements of the piezoelectric transformer drive unit are driven by a divided frequency of a pulse signal which drives the chopper.

In addition, the piezoelectric transformer inverter described above may also include an intermittent-drive control unit for making the piezoelectric transformer driving operation of the piezoelectric transformer drive unit an intermittent driving performed at a frequency lower than the piezoelectric transformer driving frequency.

In this case, preferably, a frequency of an output voltage of the drive voltage control unit is intermittently blocked by a frequency lower than the piezoelectric transformer driving frequency.

Furthermore, driving of the switching elements of the piezoelectric transformer drive unit may be intermittently stopped by a frequency lower than the piezoelectric transformer driving frequency.

Furthermore, in the above-described piezoelectric transformer inverter, the frequency control unit may include a dead time circuit having a dead-time controlling function for setting the dead time of an oscillation pulse to allow the dead time to be intermittently 100% so as to change the dead-time duty.

In addition, in the above-described piezoelectric transformer inverter, a first coil and a first switching element, and a second coil and a second switching element may be disposed as the conductive elements and switching elements of the piezoelectric transformer drive unit, and the phase drive circuit may serve as a two-phase drive circuit which alternately drives the first coil and switching element, and the second coil and switching element.

Furthermore, in the above-described piezoelectric transformer inverter, a first switching element and a second Switching element may be disposed as the switching elements of the piezoelectric transformer drive unit, and the conductive elements of the piezoelectric transformer drive unit may be auto-transformers each having a first terminal, a second terminal, and an intermediate tap. The first and second terminals of the auto-transformers are connected to the piezoelectric transformer, and the intermediate taps thereof are connected to the first and second switching elements.

However, the piezoelectric transformer drive unit may have one of a coil and an auto-transformer, and a switching element.

The conductive element of the above piezoelectric transformer drive unit may be an insulation transformer having a primary winding and a secondary winding, an end of the primary winding of the insulation transformer being connected to the switching element, and an end of the secondary winding thereof being connected to the input electrode of the piezoelectric transformer.

BRIEF DESCRIPTION OF THE DRAWINGS

FIG. 4 is a chart illustrating a voltage waveform of each part of the piezoelectric transformer inverter of the embodiment;

FIG. 6 is a chart illustrating the waveforms of signals at parts of an intermittent-drive control unit;

DESCRIPTION OF THE PREFERRED EMBODIMENTS

A description will be given of embodiments of the present invention with reference to the drawings.

Figure 1:
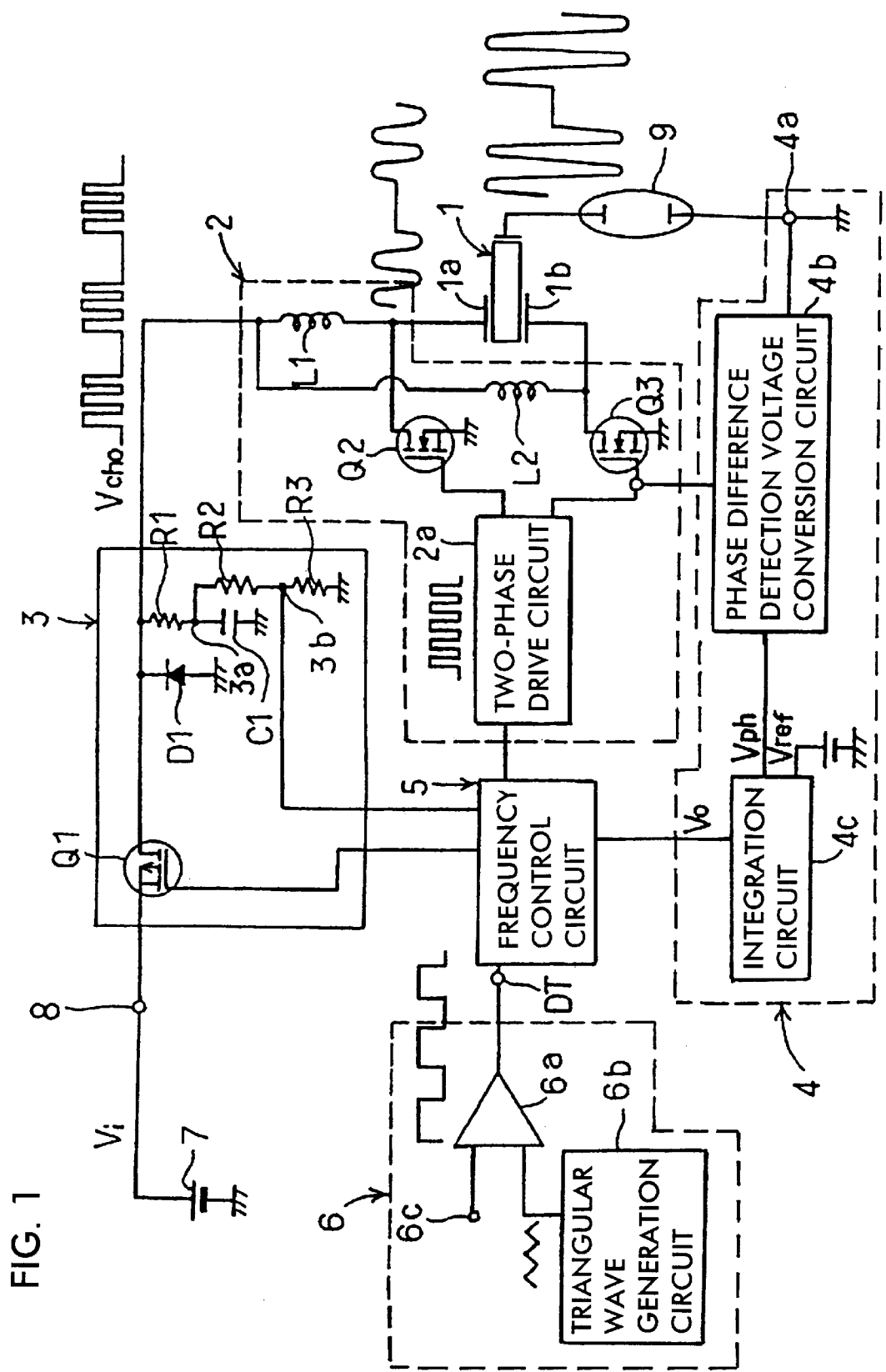
FIG. 1 is a circuit diagram of a piezoelectric transformer inverter according to a first embodiment of the present invention.

FIG. 1 is a circuit diagram of a piezoelectric transformer inverter according to a first embodiment of the present invention.

The piezoelectric transformer inverter is basically composed of a piezoelectric transformer 1, a piezoelectric transformer drive unit 2, a drive voltage control unit 3, a phase-difference constant control unit 4, a frequency control circuit 5, and an intermittent-drive control unit 6.

In addition, the piezoelectric transformer inverter used in this embodiment has an input terminal 8 connected to an external DC power source 7. A DC voltage is inputted to the drive voltage control unit 3 from the input terminal 8. As the DC power source 7, for example, conventionally, a battery or an AC adapter used in a portable information processing device, which outputs a DC voltage changing in a range of 7 to 20V, is used.

The drive voltage control unit 3 includes a p-type FET Q1. The input terminal 8 is connected to the source electrode of the FET Q1. The drain electrode of the FET Q1 is connected to the piezoelectric transformer drive unit 2. In addition, the gate electrode of the FET Q1 is connected to a frequency control circuit 5, which will be described below. A diode D1 is connected between the drain electrode of the FET Q1 and a ground potential in such a manner that the ground potential direction is set to be a reverse direction. Furthermore, a resistor R1 and a capacitor C1 are connected in series between the drain electrode of the FET Q1 and another ground potential.

A node 3a is disposed between the resistor R1 and the capacitor C1, and between the node 3a and another ground potential, voltage division resistors R2 and R3 are connected in series. In addition, a voltage division point 3b as a node disposed between the voltage division resistors R2 and R3 is connected to the frequency control circuit 5.

In the drive voltage control unit 3, the FET Q1 is switched by a pulse voltage signal supplied from the frequency control circuit 5. The diode D1 serves as a current retaining unit.

In addition, the resistor R1, the capacitor C1, and the resistors R2 and R3 form a circuit for detecting an average voltage outputted from the drive voltage control unit 3.

The piezoelectric transformer drive unit 2 converts an AC voltage inputted from the drive voltage control unit 3 into an AC voltage of a substantially constant frequency lower than the inputted AC voltage to output to the piezoelectric transformer 1.

In the piezoelectric transformer drive unit 2, a first coil L1 and a second coil L2 are used as conductive elements. One end of each of the first coil L1 and the second coil L2 is connected to an output end of the drive voltage control unit 3. The other end of the first coil L1 is connected to a first input electrode 1a of the piezoelectric transformer 1, and the other end of the second coil L2 is connected to a second input electrode 1b of the piezoelectric transformer 1.

Furthermore, the piezoelectric transformer drive unit 2 includes n-type FETs Q2 and Q3 as a first switching element and a second switching element. The drain electrode of the FET Q2 is connected to the output end of the first coil L1, and the source electrode of the FET Q2 is connected to a ground potential. In addition, the drain electrode of the FET Q3 is connected to the output end of the second coil L2, and the source electrode of the FET Q3 is connected to another ground potential. Each of the gate electrodes of the FETs Q2 and Q3 is connected to a two-phase drive circuit 2a driving the FETs Q2 and Q3 alternately.

The two-phase drive circuit 2a is connected to the frequency control circuit 5, from which a pulse voltage signal of a frequency described below is inputted to the two-phase drive circuit 2a.

The piezoelectric transformer 1 is comprised of a known Rosen-type piezoelectric transformer, and has a first input electrode 1a, a second input electrode 1b, and an output electrode 1c. When an AC voltage is applied between the input electrode 1a and the second input electrode 1b, the piezoelectric transformer 1 boosts the AC voltage to output from the output electrode 1c.

The output electrode 1c of the piezoelectric transformer 1 is connected to a discharge tube 9 as a load. The other end of the discharge tube 9 is connected to a ground potential. In addition, in order to detect a load current, a phase difference detection voltage conversion circuit 4b is connected to a node 4a disposed between the other end of the discharge tube 9 and the ground potential. The phase difference detection voltage conversion circuit 4b has another input end connected to the gate electrode of the FET Q3 as the second switching element.

In the phase difference detection voltage conversion circuit 4b, the load current inputted from the node 4a is converted into a pulse voltage, and the phase difference between the pulse voltage and the gate voltage of the FET Q3 is detected to output a voltage $V_{ph}$ corresponding to the phase difference.

An output end of the phase difference detection voltage conversion circuit 4b is connected to an integration circuit 4c. The integration circuit 4c has an input end to which a voltage $V_{ph}$ is inputted from the phase difference detection voltage conversion circuit 4b and an input end to which a specified reference voltage $V_{ref}$ is inputted therefrom. In the integration circuit 4c, comparison and integration of the voltage $V_{ph}$ and the reference voltage $V_{ref}$ are performed to output a control voltage $V_o$ corresponding to the phase difference.

The frequency control circuit 5 is connected to the integration circuit 4c in such a manner that the control voltage $V_o$ is supplied from the integration circuit 4c. When the control voltage $V_o$ corresponding to the phase difference is supplied to the frequency control circuit 5, the frequency control circuit 5 outputs a pulse voltage signal of a frequency corresponding to the control voltage $V_o$ to the two-phase drive circuit 3a, and switches on and off the FET Q1 of the drive voltage control unit 3 by the frequency of the pulse voltage signal.

In addition, in this embodiment, the frequency control circuit 5 is connected to an intermittent-drive control unit 6. The intermittent-drive control unit 6 has a comparator 6a and a triangular-wave generation circuit 6b. One input end of the comparator 6a is connected to a dimming signal input terminal 6c. A dimming signal as a voltage signal for dimming is inputted from the dimming signal input terminal 6c. The other input end of the comparator 6a is connected to the triangular-wave generation circuit 6b. The triangular-wave generation circuit 6b generates a triangular wave of a frequency lower than a piezoelectric transformer driving frequency, for example, a triangular wave of 100% to 500 Hz.

Next, a description will be given of the operation of the piezoelectric transformer inverter of the present invention.

A varying DC voltage is supplied from a DC power source 7. In the drive voltage control unit 3, an on-duty variable chopper circuit formed by the FET Q1 and the diode D1 permits the DC voltage to be converted into a rectangular-wave pulse voltage signal of a frequency higher than the piezoelectric transformer driving frequency, for example, a frequency of 240 kHz, while having a constant average voltage. The rectangular-wave pulse voltage indicated by the symbol $V_{cho}$ is outputted to the piezoelectric transformer drive unit 2. In this case, the DC voltage is converted into the pulse voltage $V_{cho}$ based on the frequency of a pulse voltage signal supplied from the frequency control circuit 5.

Figure 2:
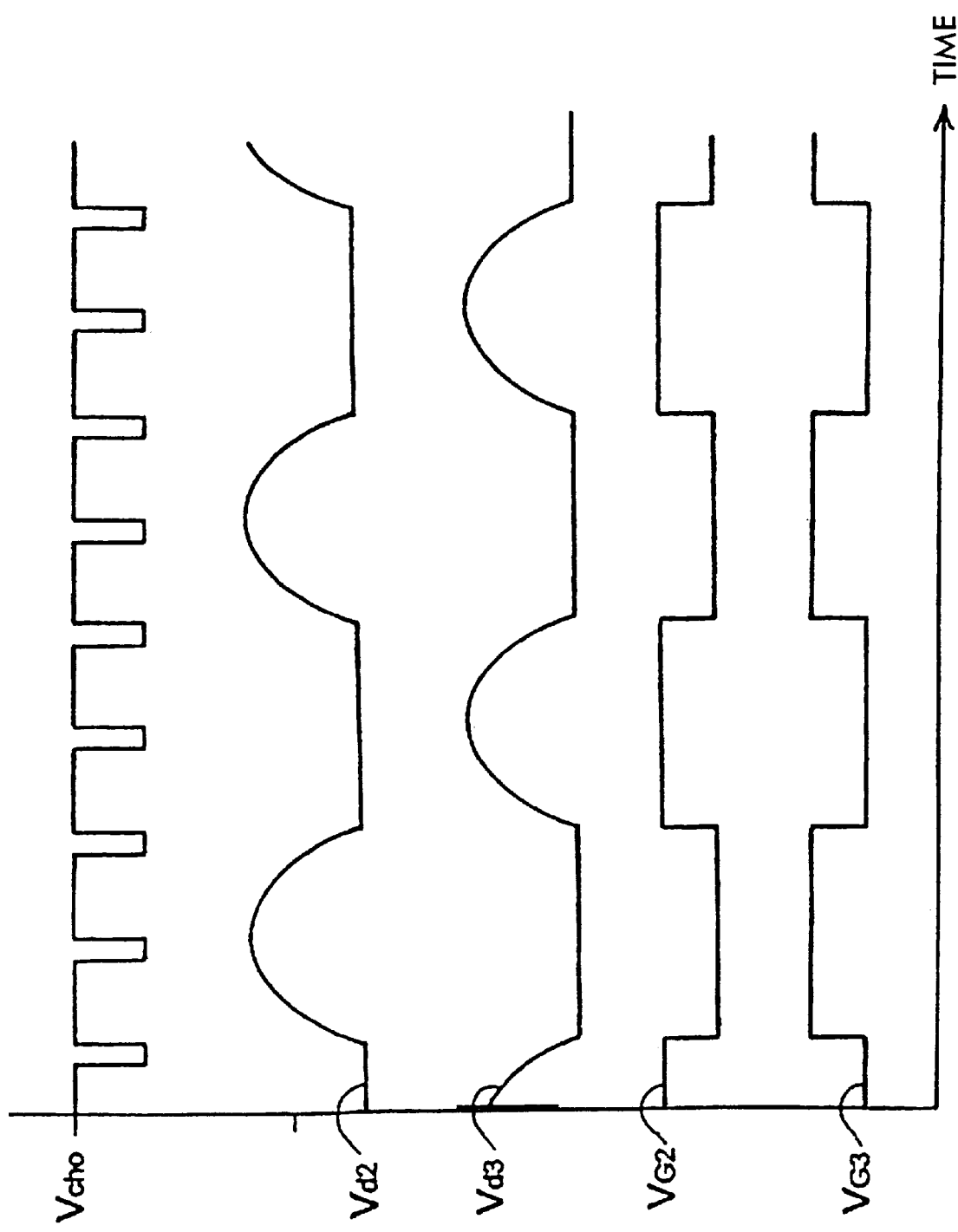
FIG. 2 is a chart illustrating a voltage waveform of each part of the piezoelectric transformer inverter according to the first embodiment, obtained when an input voltage $V_{in}$ is low.
Figure 3:
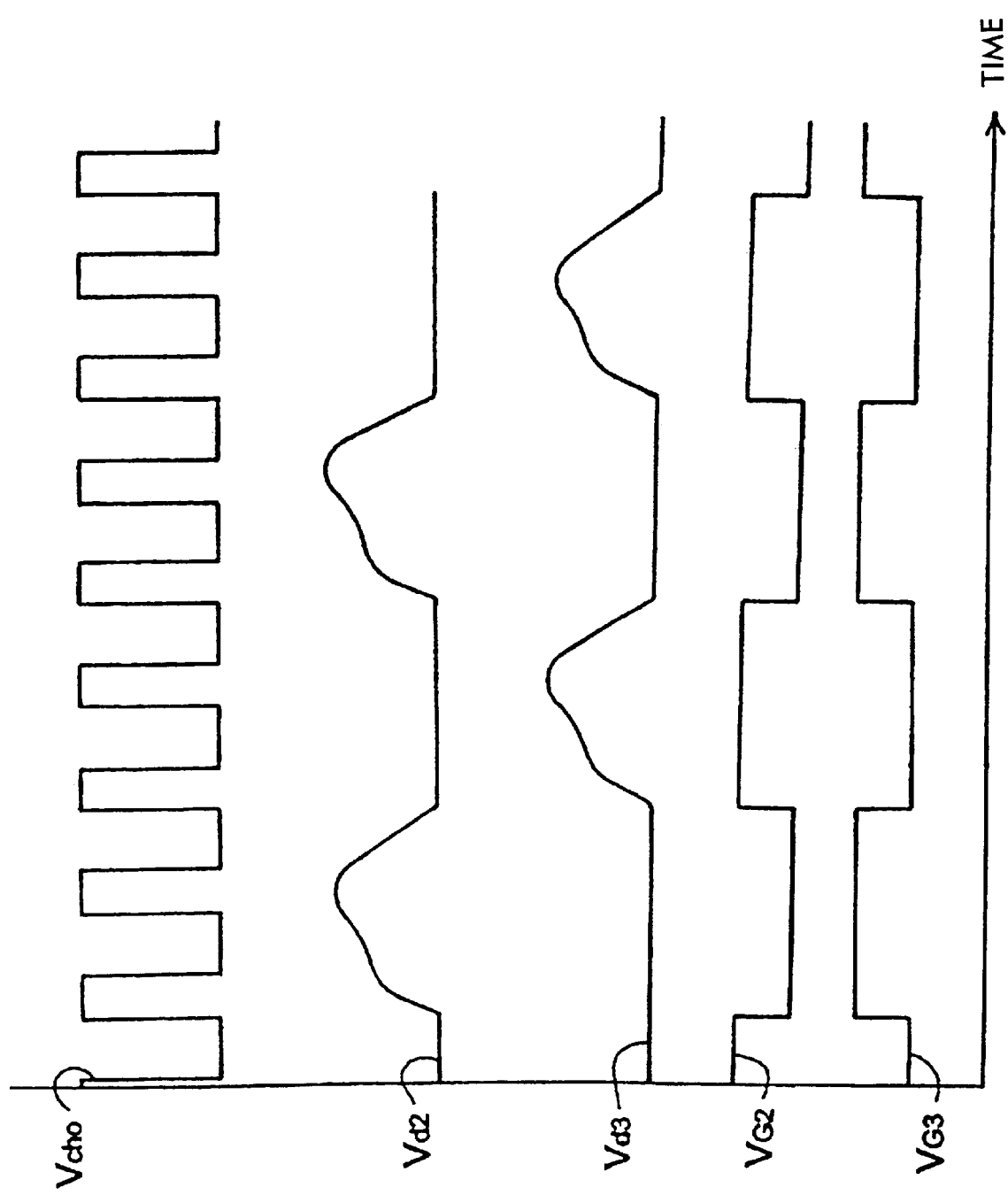
FIG. 3 is a chart illustrating a voltage waveform of each part of the piezoelectric transformer inverter according to the first embodiment, obtained when the input voltage $V_{in}$ is high.

When an input voltage indicated by the symbol $V_i$ is low, the on-duty ratio of the pulse voltage $V_{cho}$ is increased as in the case of a pulse voltage $V_{cho}$ shown in FIG. 2. When the input voltage $V_i$ is high, the on-duty ratio thereof is decreased, as shown in FIG. 3. As a result, a constant average voltage can be obtained. In other words, when the average output voltage is set such that the average output voltage is obtained by multiplying the input voltage $V_i$ by a value of the on-duty ratio, the average output voltage of the drive voltage control unit 3 can be made constant.

FIGS. 2 and 3 show graphs of voltage waveforms. In these figures, the ways in which the graphs are drawn do not indicate that the voltages of upper waveforms are higher than those of lower waveforms. For example, the way in which $V_{G2}$ is drawn does not indicate that it is larger than $V_{G3}$.

In the piezoelectric transformer drive unit 2, the rectangular wave pulse voltage supplied from the drive voltage control unit 3 is converted into an AC voltage close to the waveform of a sine wave of a frequency near to the resonant frequency of the piezoelectric transformer 1.

In addition, the two-phase drive circuit 3a inputs a rectangular wave 180° out of phase to the gate electrodes of the FETs Q2 and Q3. The gate electrodes thereof are parts to which driving signals are inputted. This permits the FETs Q2 and Q3 to be alternately switched on-off. FIG. 2 shows waveforms of the gate voltages $V_{G2}$ and $V_{G3}$ of the FETs Q2 and Q3, obtained when the input voltage $V_{in}$ is low.

FIG. 3 shows waveforms of the gate voltages $V_{G2}$ and $V_{G3}$ obtained when the input voltage $V_{in}$ is high.

When the FET Q2 is in an off state and the FET Q3 is in an on state, an LC series resonance is generated by the first coil L1 and the input capacitance of the piezoelectric transformer 1, by which a half sine wave is generated at the first input electrode 1a of the piezoelectric transformer 1. In contrast, when the FET Q2 is in an on state and the FET Q3 is in an off state, a series resonance is generated by the inductance of the second coil L2 and the input capacitance of the piezoelectric transformer 1, by which a half sine wave is generated at the second input electrode 1b of the piezoelectric transformer 1.

In FIG. 2, voltages $V_{d2}$ and $V_{d3}$ show waveforms of the drain voltages of the FETs Q2 and Q3 obtained when the input voltage $V_{in}$ is low. In FIG. 3, voltages $V_{d2}$ and $V_{d3}$ show waveforms of the drain voltages of the FETs Q2 and Q3 obtained when the input voltage $V_{in}$ is high.

With this arrangement, when the FETs Q2 and Q3 are alternately driven, an AC voltage having a waveform close to that of a sine wave is applied to each of the first input electrode 1a and the second input electrode 1b of the piezoelectric transformer 1.

Preferably, inductance values of the coils L1 and L2 are selected in such a manner that a resonant frequency obtained when the input capacitance of the piezoelectric transformer 1 and the coils L1 and L2 produce resonance is set to be slightly higher than the resonant frequency of the piezoelectric transformer 1.

In this way, an alternating current having a waveform close to that of a sine wave, for example, a current of 60 kHz with 10 V rms is applied to the piezoelectric transformer 1 from the piezoelectric transformer drive unit 3. The piezoelectric transformer 1 boosts the applied voltage and output the boosted voltage from the output electrode 1c.

The boosted high-tension AC voltage, such as a voltage of 60 kHz with 500 V rms, is supplied to the discharge tube 9. With the high voltage, for example, a tube current of approximately 60 kHz with 3 to 5 mA rms flows through the discharge tube 9, with the result that the discharge tube 9 is lit.

The tube current is inputted to the phase difference detection voltage conversion circuit 4b, in which the inputted tube current is converted into a pulse voltage corresponding to the tube current. Furthermore, a driving signal of the FET Q3, that is, the gate voltage thereof is also inputted to the phase difference detection voltage conversion circuit 4b. The phase difference detection voltage conversion circuit 4b detects the phase difference between the gate voltage of the FET Q3 and the pulse voltage corresponding to the tube current to output a DC voltage $V_{ph}$ corresponding to the phase difference.

The integration circuit 4c performs comparison and integration of the DC voltage $V_{ph}$ outputted from the phase difference detection voltage conversion circuit 4b and a predetermined reference voltage $V_{ref}$ to output a control voltage $V_o$ to the frequency control circuit 5.

Figure 5:
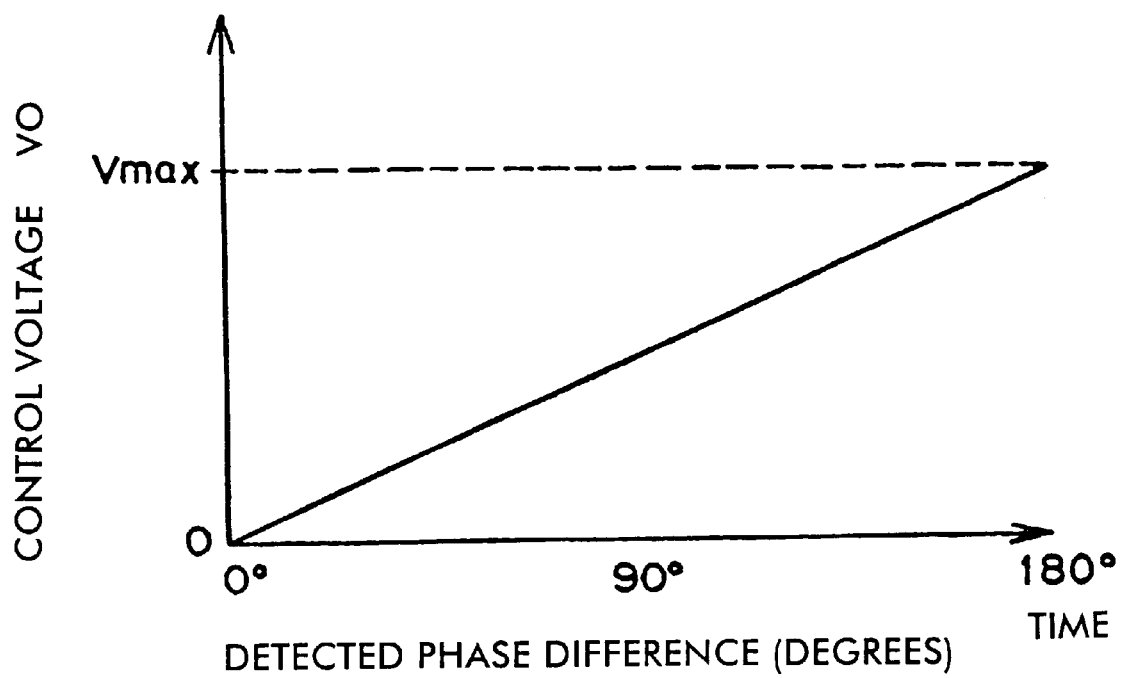
FIG. 5 is a graph showing the relationship between an output voltage of a phase-difference detection voltage conversion circuit and a detected phase difference.

In other words, the driving signal of the FET Q3 and the tube current as a load current are converted into rectangular waves having the same half cycle, phase, and frequency to obtain a logical AND of both currents so as to obtain the rectangular wave of a duty ratio corresponding to the phase difference. Then, the rectangular wave is smoothed to output a control voltage $V_o$ in proportion to the duty ratio. The control voltage $V_o$ outputted from the integration circuit 4c is in proportion to the phase difference detected by the phase difference detection voltage conversion circuit 4b as described above (See FIG. 5)

The frequency control circuit 5, to which the control voltage $V_o$ is inputted, outputs a rectangular wave pulse voltage signal of a frequency determined by the value of the control voltage $V_o$ to the two-phase drive circuit 2a of the piezoelectric transformer drive unit 2.

The two-phase drive circuit 2a switches the FETs Q2 and Q3 on and off according to the frequency of the rectangular wave pulse voltage signal supplied from the frequency control circuit 5. Similarly, the above rectangular wave pulse voltage signal supplied from the frequency control circuit 5 is supplied to the gate electrode of the FET Q1 of the drive voltage control unit 3, and the FET Q1 is switched on and off by the frequency of the rectangular wave.

In addition, in the intermittent drive unit 6, a dimming signal voltage inputted from the outside is inputted to one of the input terminals of the comparator 6a. The dimming signal is, as shown in FIG. 6, a DC voltage signal.

In the comparator 6a, the triangular wave, which is seen in FIG. 6 waveform (a), generated at the triangular-wave generation circuit 6b, is compared with the above dimming signal, by which a burst signal of a rectangular wave in which the on-duty ratio is changed is outputted. FIG. 6 waveform (b) indicates the waveform of the burst signal.

The burst signal is inputted to a dead-time terminal DT disposed in the frequency control circuit 5. Thus, with the triangular wave frequency, for example, a frequency of 200 kHz, the dead time of the FET Q1 is intermittently set to be 100%. That is, a rectangular wave output pulse indicated by FIG. 6 waveform (d), which is supplied to the piezoelectric transformer drive unit 2 from the drive voltage control unit 3, is switched on and off by the triangular wave frequency. As a result, the piezoelectric transformer 1 is intermittently driven, and current flowing through the discharge tube 9 is also intermittently in the on-off state, as seen in FIG. 6 waveform (e).

Therefore, when a cold-cathode tube is used as the discharge tube 9, the on-duty ratio control described above permits the burst dimming to be performed.

Figure 7:
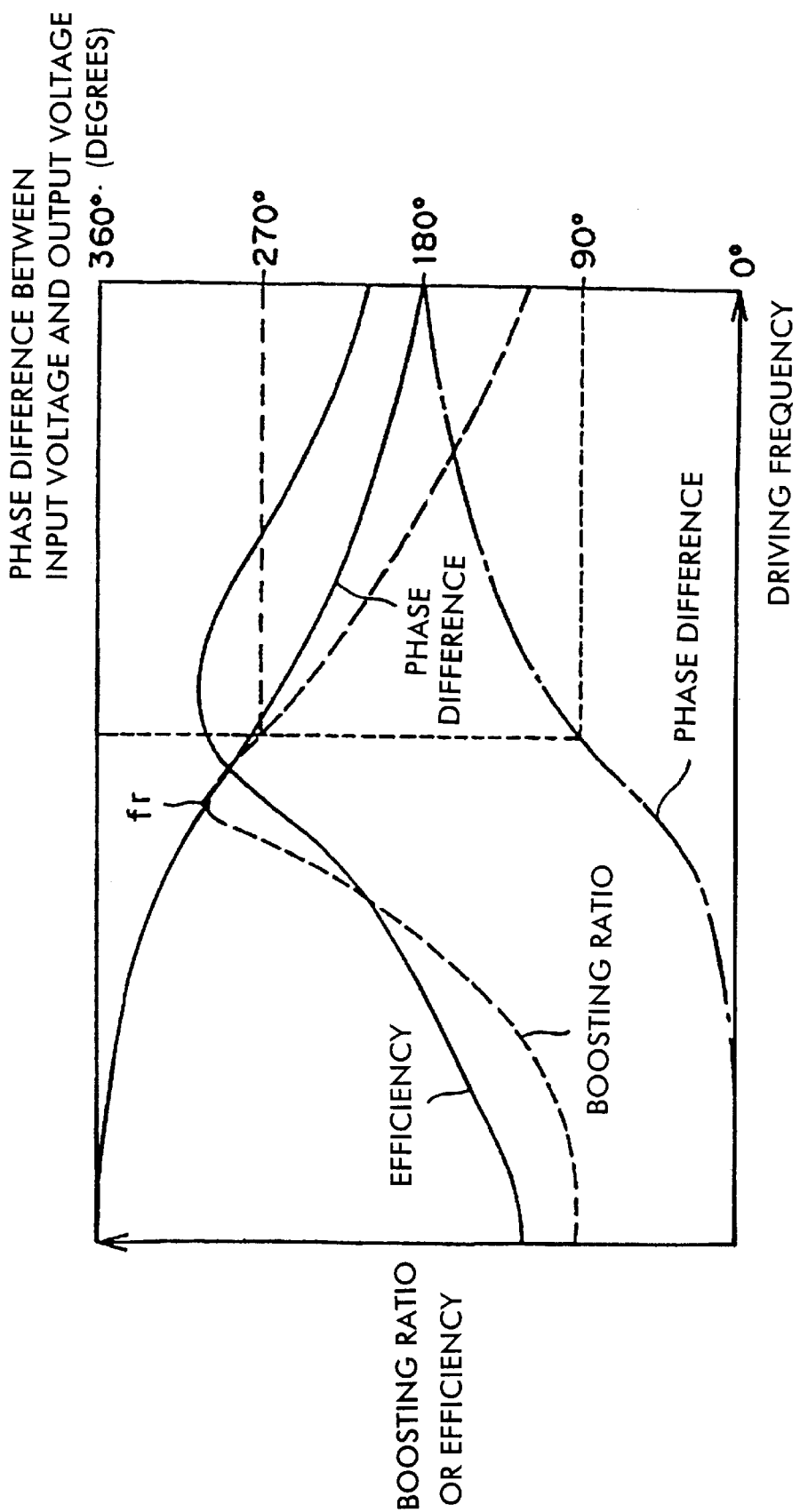
FIG. 7 is a graph showing frequency characteristics of a boosting ratio, efficiency, and phase differences of a piezoelectric transformer.

FIG. 7 shows driving frequency dependences of the boosting ratio and efficiency of the piezoelectric transformer 1, and driving frequency dependence of the phase difference between the input voltage and output voltage of the piezoelectric transformer 1. As is evident in FIG. 7, the efficiency of the piezoelectric transformer 1 reaches its peak at a frequency slightly higher than a frequency at which a boosting ratio reaches its peak. In addition, the phase difference between the input voltage and output voltage of the piezoelectric transformer 1 can belong to one of the following cases (1) and (2).

(1) The phase difference is in proximity to 0° on the side of frequencies lower than a resonant frequency, and the phase difference is in proximity to 180° on the side of frequencies higher than the resonant frequency. The efficiency frequency peaks, when the phase difference is in proximity to 90°.

(2) The phase difference is in proximity to 0° (360°) on the side of frequencies lower than a resonance frequency, and the phase difference is in proximity to −180° (180°) on the side of frequencies higher than the resonance frequency. The efficiency frequency peaks, when the phase difference is in proximity to −90° (270°).

Whether the phase difference between the input voltage and output voltage of the piezoelectric transformer 1 belongs to (1) or (2) is determined by which switching element of the FET Q2 and the FET Q3 is used to obtain a switching element drive controlling signal, or by a polarization direction of the piezoelectric transformer 1. Therefore, one of the cases (1) and (2) can be selected according to design conditions.

As described above, in the piezoelectric transformer inverter of the first embodiment, instead of the input voltage waveform of the piezoelectric transformer 1, the phase difference between the drive Controlling signal of the FET Q3 as the switching element used for a piezoelectric transformer drive unit, which is indicated by FIG. 4 waveform (a), and the tube current indicated by FIG. 4 waveform (b) as the output current of the piezoelectric transformer 1 is detected, as shown in FIG. 4 waveform (e). Then, the driving frequency is controlled in such a manner that the phase difference can be maintained constant to be a phase difference in which the efficiency of the piezoelectric transformer 1 reaches its peak. As a result, even though the load condition of the piezoelectric transformer 1 and the ambient temperature thereof are changed, the piezoelectric transformer 1 can be driven at the frequency of highest efficiency.

In the above embodiment, the phase difference between the drive controlling signal of the switching element used for the piezoelectric transformer drive unit 3 and the tube current as the output current of the piezoelectric transformer 1 is detected. However, the phase difference between the switching element drive controlling signal shown in FIG. 4 waveform (a) and the output voltage of the piezoelectric transformer 1 may be detected.

Figure 8:
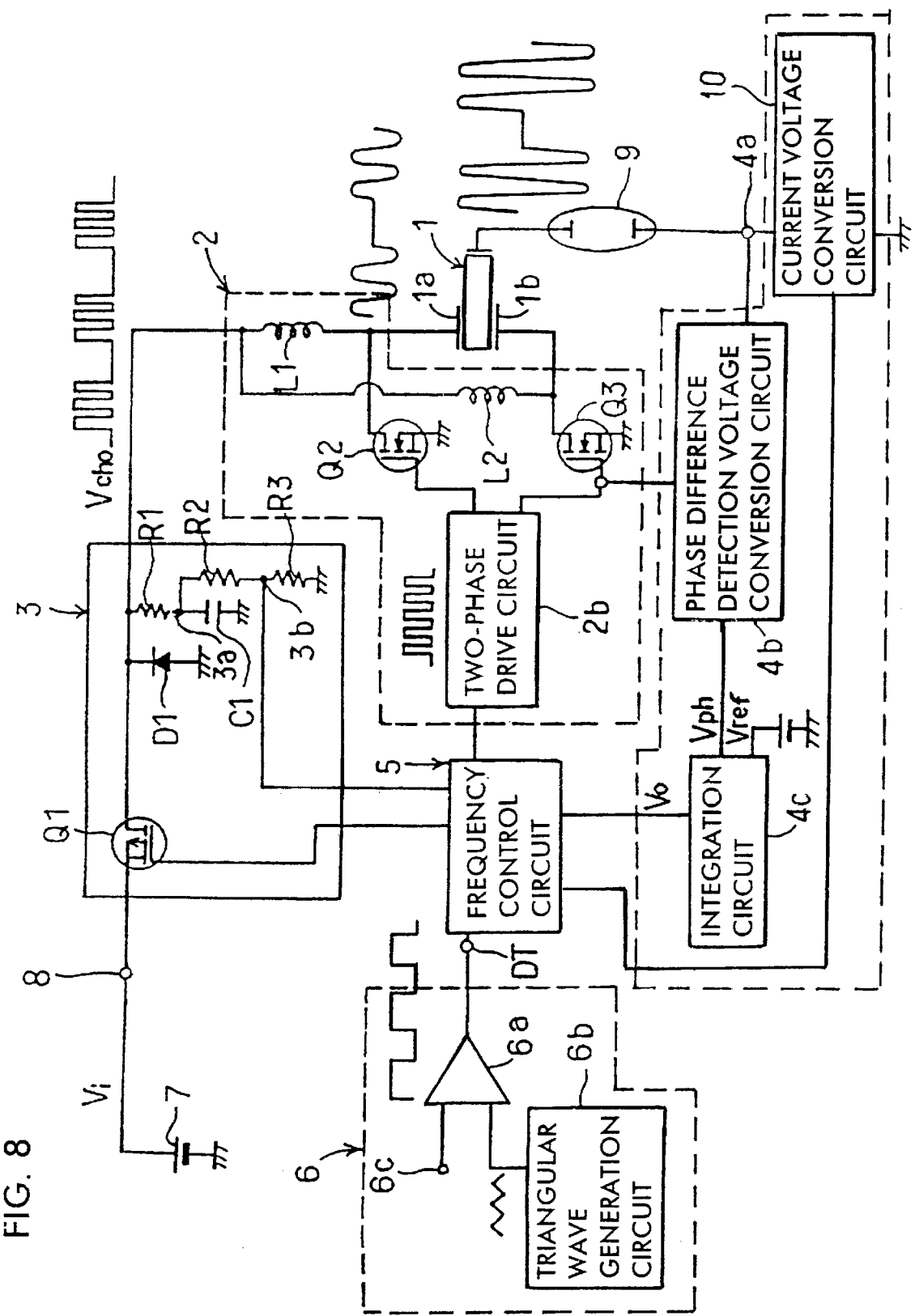
FIG. 8 is a circuit diagram of a piezoelectric transformer inverter according to a second embodiment of the present invention.

FIG. 8 is a circuit diagram illustrating a piezoelectric transformer inverter according to a second embodiment of the present invention. In the second embodiment, a discharge tube 9 is connected to a current voltage conversion circuit 10. For example, the current voltage conversion circuit 10 is formed by connecting a current detection resistor between an end of the discharge tube 9 and a ground potential, and connecting a rectifying circuit for converting an AC voltage into a DC voltage to a node disposed between the current detection resistor and the discharge tube 9.

The current voltage conversion circuit 10 converts the tube current into a DC voltage corresponding to the magnitude of the tube current. The DC voltage is inputted to a frequency control circuit 5.

In the frequency control circuit 5, based on the DC voltage proportionate to the tube current, a specified frequency signal is outputted to an FET Q1 to change the on-duty ratio of the FET Q1. That is, the on-duty ratio of the FET Q1 is controlled by the above frequency signal in such a manner that the value of the tube current can be a desired value. As a result, the control can be performed in such a manner that the tube current can be maintained to be constant, with respect to changes in temperature and load conditions in addition to changes in the tube current occurring when the input voltage is changed. This permits the luminance of the discharge tube 9 to be controlled in a stable manner.

Additionally, in the second embodiment, as an alternative to the two-phase drive circuit 2a, a two-phase drive frequency-division circuit 2b is disposed. The frequency of the pulse voltage signal outputted from the frequency control circuit 5 is divided to have one-quarter frequency by the two-phase drive frequency-division circuit 2b, and FETs Q2 and Q3 are driven by the divided-frequency signal.

Figure 9:
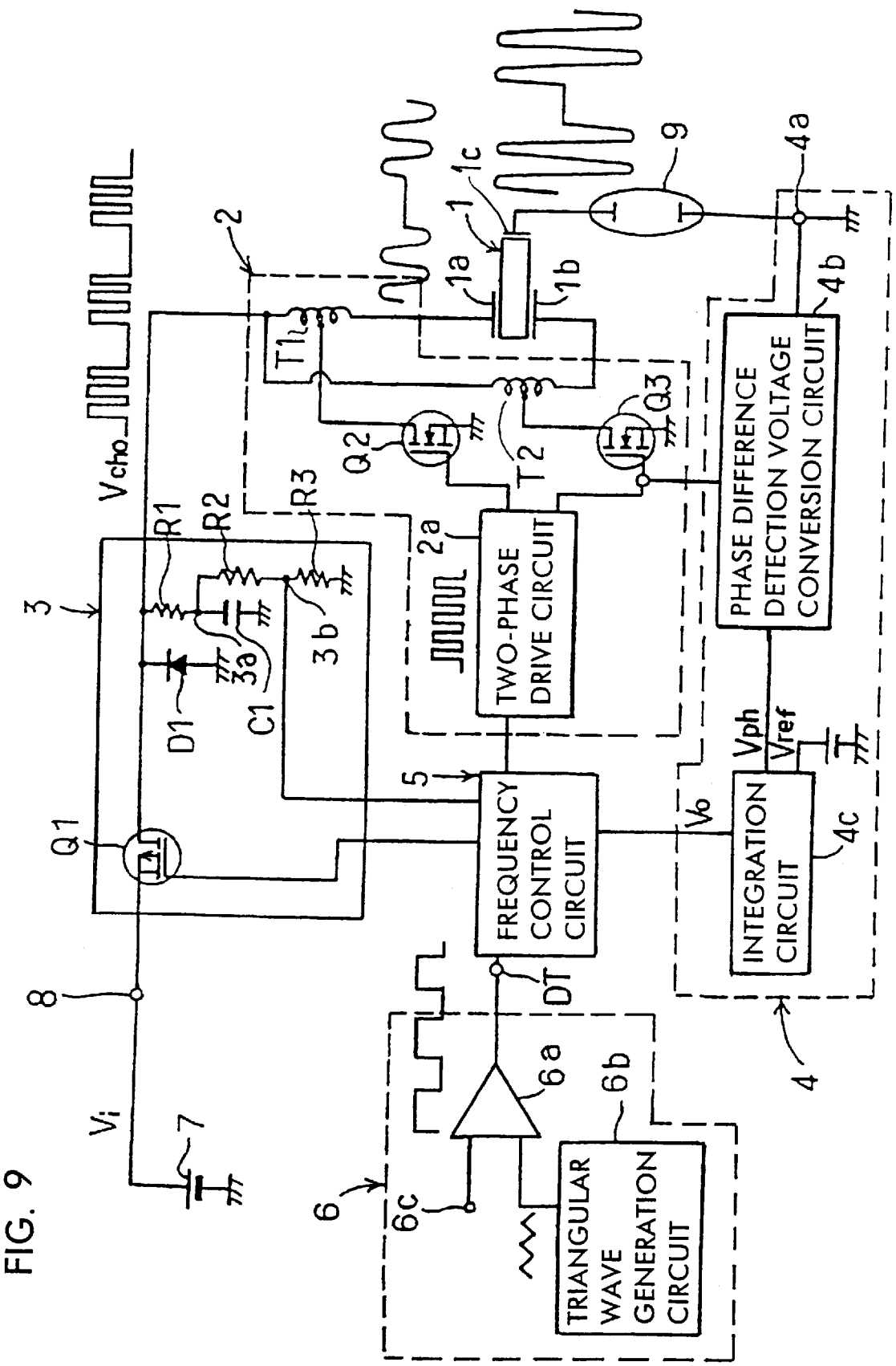
FIG. 9 is a circuit diagram of a piezoelectric transformer inverter according to a third embodiment of the present invention.

FIG. 9 is a circuit diagram of a piezoelectric transformer inverter according to a third embodiment of the present invention. In the third embodiment, in a piezoelectric transformer drive unit 2, instead of the coils L1 and L2, auto-transformers T1 and T2 are used. In the auto-transformers T1 and T2, the winding ratio between a primary winding and a secondary winding is set to be 1:N (N is an arbitrary integer).

Each of the auto-transformers T1 and T2 has a first terminal, a second terminal, and an intermediate tap. The first terminals of the auto-transformers T1 and T2 are connected to a drive voltage control unit 3. In addition, the second terminal of the auto-transformer T1 is connected to a first input electrode 1a of a piezoelectric transformer 1, and the second terminal of the auto-transformer T2 is connected to a second input electrode 1b of the piezoelectric transformer 1. Furthermore, the intermediate taps of the auto-transformers T1 and T2 are connected to the drain electrodes of the FETs Q2 and Q3, respectively.

The other structural parts in the third embodiment are the same as those in the first embodiment.

In the third embodiment, the auto-transformers T1 and T2 are used, and the winding ratio between the primary winding and the secondary winding of the auto-transformers T1 and T2 is set to be 1:N. As a result, a voltage inputted to the piezoelectric transformer 1 is increased to be (1+N) times as much as that in the first embodiment. Accordingly, the auto-transformers may be suitably used when the boosting ratio of the piezoelectric transformer 1 is low, and when the input voltage $V_{in}$ of the piezoelectric transformer 1 is low.

Figure 10:
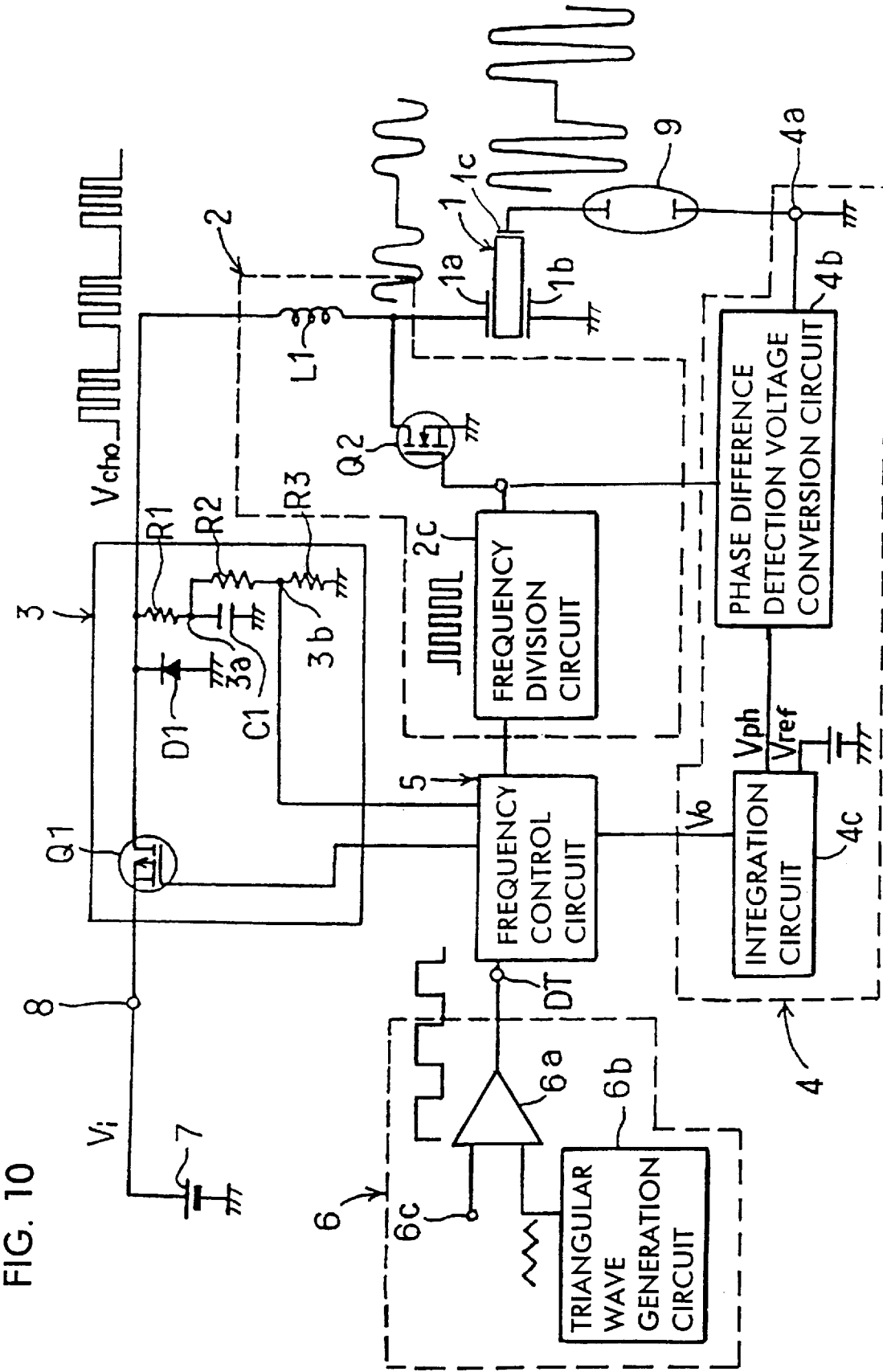
FIG. 10 is a circuit diagram of a piezoelectric transformer inverter according to a fourth embodiment of the present invention.

FIG. 10 is a circuit diagram illustrating a piezoelectric transformer inverter according to a fourth embodiment of the present invention.

In the fourth embodiment, only a single coil L1 and a FET Q2 as a single switching element are used in a piezoelectric transformer drive unit 2. Specifically, one end of the coil L1 is connected to a drive voltage control unit 3, and the other end thereof is connected to a first input electrode 1a of a piezoelectric transformer 1. A second input electrode 1b of the piezoelectric transformer 1 is connected to a ground potential.

The drain electrode of the FET Q2 is connected to the coil L1, and the source electrode of the FET Q2 is connected to a ground potential. In addition, since the piezoelectric transformer drive unit 2 uses the single FET Q2 only, a frequency division circuit 2c as a phase drive circuit is used. The frequency division circuit 2c is connected to the gate electrode of the FET Q2. Furthermore, the gate electrode of the FET Q2 is also connected to a phase difference detection voltage conversion circuit 4b.

Meanwhile, a frequency-controlling pulse voltage signal supplied from a frequency control circuit 5 is inputted to the frequency division circuit 2c.

The other parts in the fourth embodiment are the same as those shown in the first embodiment.

In the fourth embodiment, since only a single FET Q2 and a single coil L1 are used, a voltage applied to the first input electrode 1a and second input electrode 1b of a piezoelectric transformer 1 forms a half sine wave. Therefore, when compared to the case in which the voltage having a waveform substantially the same as that of a sine wave is inputted, as shown in the first embodiment, the output voltage in the fourth embodiment becomes approximately ½. As a result, when a piezoelectric transformer drive unit as used in the fourth embodiment is applied to a case not requiring such a boosting ratio, the number of components and the production cost can be reduced.

Figure 11:
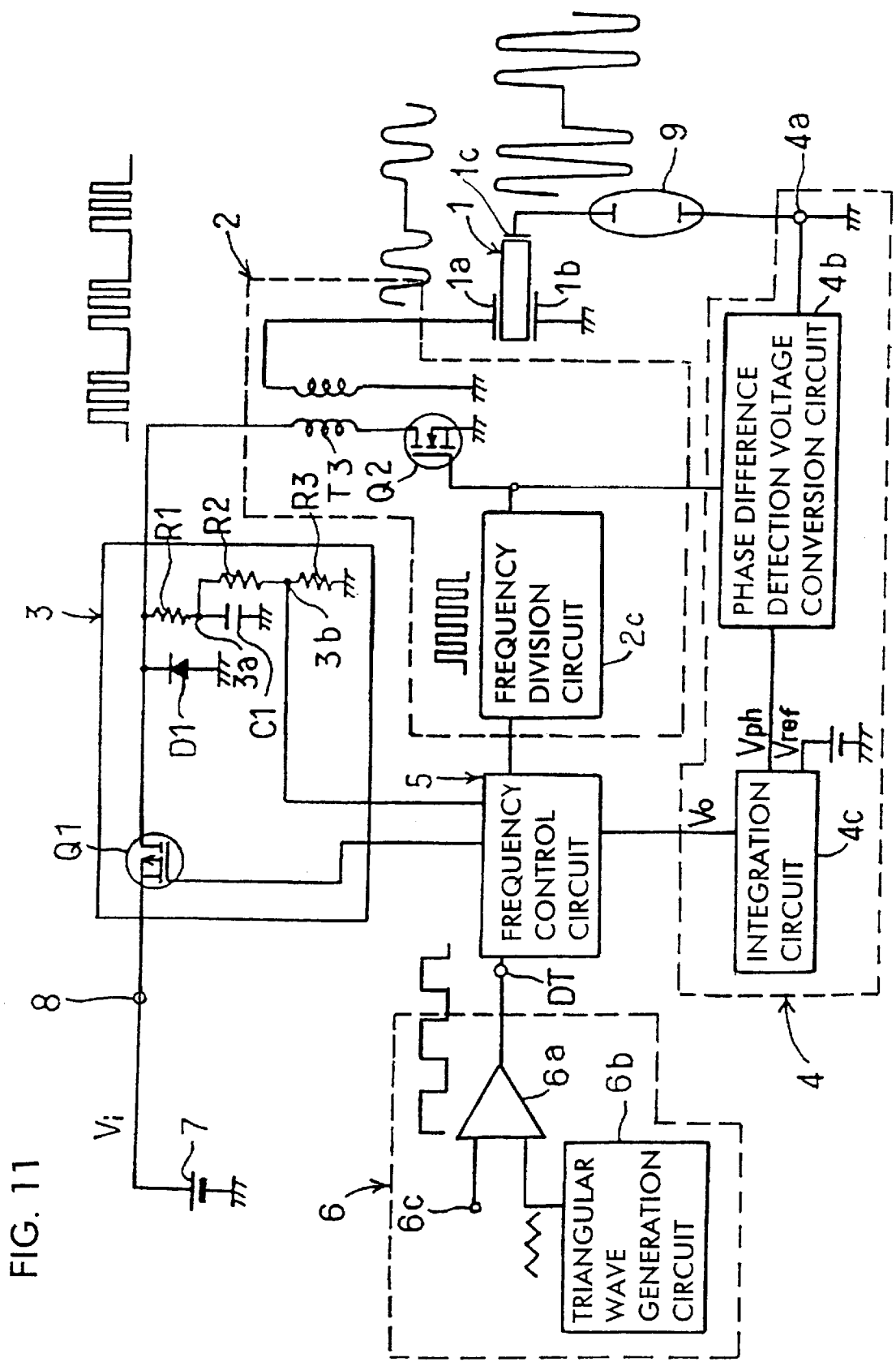
FIG. 11 is a circuit diagram of a piezoelectric transformer inverter according to a fifth embodiment of the present invention.
Figure 12:
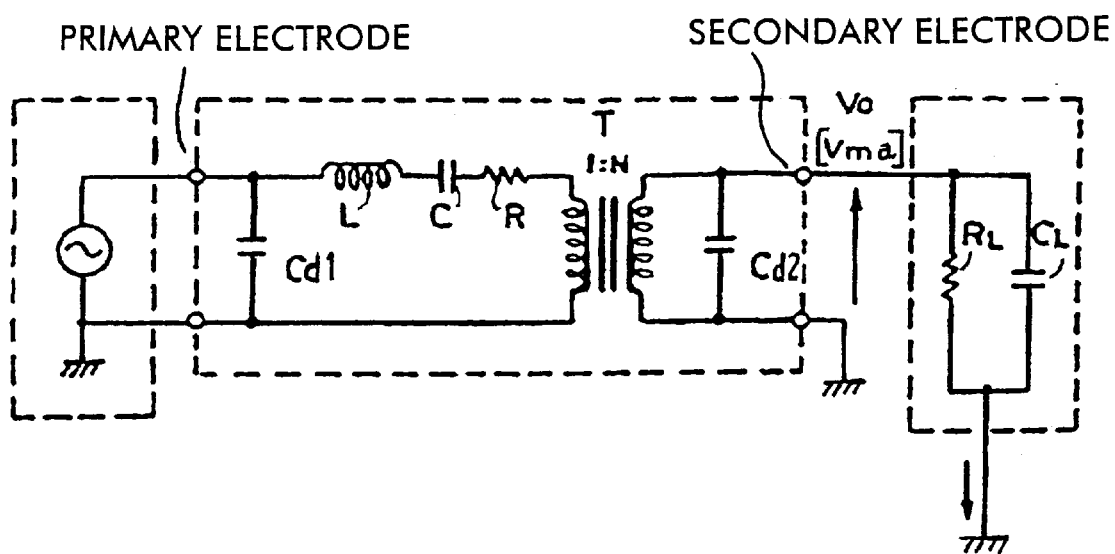
FIG. 12 is a typical equivalent circuit diagram of a piezoelectric transformer.
Figure 13:
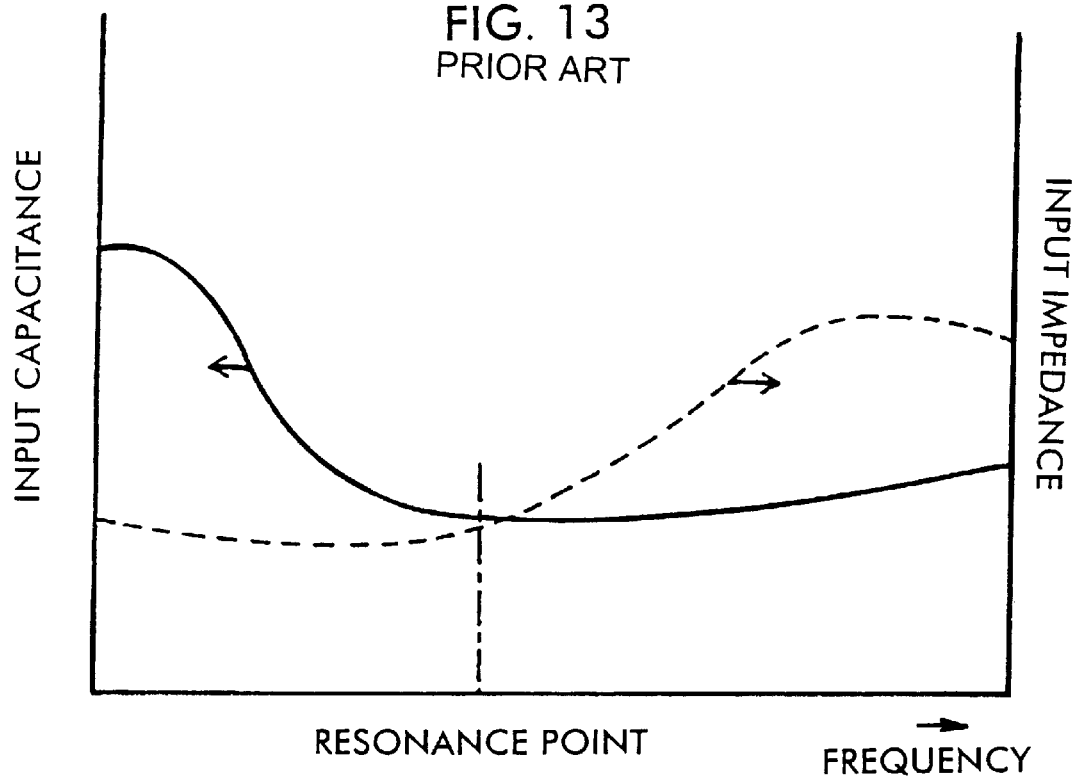
FIG. 13 is a graph showing frequency characteristics of input capacitance of a piezoelectric transformer and input impedance thereof.

FIG. 11 is a circuit diagram illustrating a piezoelectric transformer inverter according to a fifth embodiment of the present invention.

In the fifth embodiment, as an alternative to the coil L1, an insulation transformer T3 is used as a conductive element used in a piezoelectric transformer drive unit 2. The other structural parts are the same as those in the fourth embodiment. In the insulation transformer T3, an end of a primary winding is connected to a drive voltage control unit 3, and the other end thereof is connected to the drain electrode of an FET Q2. In addition, an end of a secondary winding of the insulation transformer T3 is connected to a ground potential, and the other end thereof is connected to a first input electrode 1a of a piezoelectric transformer 1.

In the insulation transformer T3, the winding ratio between the primary winding and the secondary winding is set to be 1:N.

In the fifth embodiment, since a voltage inputted to the piezoelectric transformer 1 forms a sine wave, the efficiency can be increased more than in the case of the fourth embodiment. In addition, since the fifth embodiment uses the insulation transformer T3 of the aforementioned winding ratio, the voltage applied to the piezoelectric transformer 1 is set to be N times as much as that in the first embodiment. Thus, the insulation transformer T3 may be suitably used when the boosting ratio of the piezoelectric transformer 1 is low, and when the input voltage $V_{in}$ of the piezoelectric transformer 1 is low.

As described above, in the piezoelectric transformer inverter according to the present invention, the piezoelectric transformer drive unit drives the piezoelectric transformer. The piezoelectric transformer drive unit includes conductive elements, switching elements, and a phase drive circuit to which a pulse voltage signal driving the switching elements is inputted. A phase difference detecting unit detects the phase difference between a driving signal controlling the on-off operation of the switching elements and the output current or output voltage of the piezoelectric transformer. Then, a voltage corresponding to the phase difference is outputted, and in a frequency control unit, a pulse voltage signal of a frequency for controlling the phase difference based on the voltage supplied from the phase difference detecting unit is outputted to the phase difference drive circuit of the piezoelectric transformer drive unit in such a manner that the value of the phase difference is set to be a desired value.

That is, the switching element driving signal is used as one of the signals detecting the phase difference in the constant phase-difference control system. While the input voltage of the piezoelectric transformer is significantly influenced by changes in frequency, load, and input voltage, the switching element driving signal is unlikely to be influenced by these factors, and the driving signal forms a rectangular wave. Therefore, when the switching element driving signal is used as a phase difference detecting signal, a cycle, a phase difference, and a frequency, can be reliably detected.

As compared to a case in which the input voltage of the piezoelectric transformer is used as a phase difference detecting signal, the present invention permits the phase difference to be more accurately detected. Accordingly, when a driving frequency is controlled in such a manner that the phase difference between the switching element driving signal and the output voltage or output current of the piezoelectric transformer can be maintained constant, even though load conditions and ambient temperature change, the piezoelectric transformer can be driven by the highest-efficiency frequency of the piezoelectric transformer.

Furthermore, according to some aspects of the present invention, since an average voltage outputted to the piezoelectric transformer drive unit is maintained constant by the drive voltage control unit, the piezoelectric transformer can be driven in a wider range of input voltages.

Furthermore, according to another aspect of the present invention, the drive voltage control unit has a chopper unit, and the switching elements of the piezoelectric transformer drive unit are driven by the divided frequency of a pulse signal driving the chopper unit. Thus, the piezoelectric transformer drive unit permits the pulse voltage supplied from the drive voltage control unit to be converted into an AC voltage having a waveform substantially close to that of a sine wave.

Furthermore, according to another aspect of the present invention, an intermittent-drive control unit is also disposed for making the driving of the piezoelectric transformer drive unit an intermittent driving performed at a frequency lower than the piezoelectric transformer driving frequency. Thus, the intermittent-drive control unit permits a burst dimming to be performed, which can broaden the range of dimming. In addition, in retaining the burst at a burst-dimming operation, the input voltage waveform of the piezoelectric transformer does not occur. However, in the present invention, instead of the input voltage waveform of the piezoelectric transformer, the driving signal of the switching element is used as a phase difference detecting signal. Thus, even when the burst dimming is performed, the phase difference can be reliably controlled, and high efficiency can be maintained over a wide range of input voltages and dimming.

Regarding the intermittent-drive control unit, the output of the drive voltage control unit may be intermittently stopped. Alternatively, the driving of the switching element may be intermittently stopped.

According to another aspect of the present invention, since the frequency control unit has the dead-time circuit, when the dead time is intermittently set to be 100% so as to change the dead-time duty, burst dimming can be achieved.

Furthermore, according to another aspect of the present invention, the two-phase drive circuit alternately drives the first coil and switching element, and the second coil and switching element. With this arrangement, a voltage inputted to the piezoelectric transformer approximately forms a sine wave, which can increase the output voltage of the piezoelectric transformer.

According to another aspect of the present invention, since auto-transformers as conductive elements are connected to the first and second switching elements, respectively, auxiliary boosting can be performed in the auto-transformers according to the winding ratios between the primary windings and secondary windings of the auto-transformers. Therefore, the boosting ratio of the piezoelectric transformer can be compensated, and this arrangement can be suitably used when the input voltage is low.

Furthermore, according to another aspect of the present invention, since the piezoelectric transformer drive unit has a single coil and a single switching element, the number of components can be reduced and cost reduction can be achieved.

Furthermore, according to another aspect of the present invention, the conductive element of the piezoelectric transformer drive unit is an insulation transformer. One end of a primary winding of the insulation transformer is connected to a switching element, and one end of a secondary winding thereof is connected to the input electrode of the piezoelectric transformer. With this arrangement, auxiliary boosting can be performed according to the winding ratio between the primary winding and secondary winding of the insulation transformer. As a result, the boosting ratio of the piezoelectric transformer can be compensated, and this arrangement can be suitably used when the input voltage of the piezoelectric transformer is low.

In addition, obviously, many modifications and variations of the present invention are possible in the light of the above teachings. It is therefore to be understood that the invention may be practiced otherwise than as specifically described within the scope of the appended claims.

What is claimed is:

1. A piezoelectric transformer inverter, which drives a load by a piezoelectric transformer, comprising:

a piezoelectric transformer which has an input electrode and an output electrode and which boosts an AC voltage applied to the input electrode to supply the boosted AC voltage to a load connected to the output electrode;

piezoelectric transformer driving means connected to the piezoelectric transformer to drive the piezoelectric transformer, the piezoelectric transformer driving means having conductive elements, switching elements, and a phase drive circuit into which a pulse voltage signal for driving the switching elements is inputted, and converting an inputted AC voltage into an AC voltage of a substantially constant frequency lower than the inputted voltage to output to the piezoelectric transformer;

phase-difference detecting means for detecting the phase difference between a driving signal for controlling the on-off operation of the switching elements and an output current or an output voltage of the piezoelectric transformer to output a control voltage corresponding to the phase difference; and frequency controlling means for outputting a pulse voltage signal of a frequency based on the control voltage outputted from the phase-difference detecting means to the phase difference drive circuit of the piezoelectric transformer driving means so that the value of the phase difference can be a desired value.

2. A piezoelectric transformer inverter according to claim 1, further comprising drive voltage controlling means connected between a DC power source and the piezoelectric transformer driving means, the drive voltage controlling means converting a DC voltage supplied from the DC power source into a variable duty-ratio pulse voltage by a frequency higher than a DC frequency or a piezoelectric transformer driving frequency to perform control an average voltage outputted to the piezoelectric transformer driving means so as to have a constant value.

3. A piezoelectric transformer inverter according to claim 1, further comprising drive voltage controlling means connected between a DC power source and the piezoelectric transformer driving means, the drive voltage controlling means converting a DC voltage supplied from the DC power source into a variable duty-ratio pulse voltage by a frequency higher than a DC frequency or a piezoelectric transformer driving frequency to control an average voltage outputted to the piezoelectric transformer driving means so that the value of the output current of the piezoelectric transformer is set to be a desirable value.

4. A piezoelectric transformer inverter according to any one of claims 2 and 3, wherein the drive voltage controlling means has a chopper, and the switching elements of the piezoelectric transformer driving means are driven by a divided frequency of a pulse signal which drives the chopper.

5. A piezoelectric transformer inverter according to any one of claims 1 to 3, further comprising intermittent-drive controlling means for making the piezoelectric transformer driving operation of the piezoelectric transformer driving means an intermittent driving performed at a frequency lower than the piezoelectric transformer driving frequency.

6. A piezoelectric transformer inverter according to claim 5, wherein a frequency of an output voltage of the drive voltage controlling means is intermittently blocked by a frequency lower than the piezoelectric transformer driving frequency.

7. A piezoelectric transformer inverter according to claim 5, wherein driving of the switching elements of the piezoelectric transformer driving means is intermittently stopped by a frequency lower than the piezoelectric transformer driving frequency.

8. A piezoelectric transformer inverter according to claim 5, wherein the frequency controlling means includes a dead time circuit having a dead-time controlling function for setting the dead time of an oscillation pulse to allow the dead time to be intermittently 100% so that a dead-time duty is changed.

9. A piezoelectric transformer inverter according to claim 5, wherein a first coil and a first switching element, and a second coil and a second switching element are disposed as the conductive elements and switching elements of the piezoelectric transformer driving means, and the phase drive circuit serves as a two-phase drive circuit which alternately drives the first coil and switching element, and the second coil and switching element.

10. A piezoelectric transformer inverter according to claim 5, wherein a first switching element and a second switching element are disposed as the switching elements of the piezoelectric transformer driving means, and the conductive elements of the piezoelectric transformer driving means are auto-transformers each having a first terminal, a second terminal, and an intermediate tap, the first and second terminals of the auto-transformers being connected to the piezoelectric transformer, and the intermediate tap thereof being connected to the first and second switching elements.

11. A piezoelectric transformer inverter according to claim 5, wherein the piezoelectric transformer driving means has one of a coil and an auto-transformer, and a switching element.

12. A piezoelectric transformer inverter according to claim 11, wherein the conductive element of the piezoelectric transformer driving means is an insolation transformer having a primary winding and a secondary winding, an end of the primary winding of the insulation transformer being connected to the switching element, and an end of the secondary winding thereof being connected to the input electrode of the piezoelectric transformer.

* * * * *